(12) United States Patent
Matsumaru

(10) Patent No.: US 10,763,200 B2
(45) Date of Patent: Sep. 1, 2020

(54) MOUNTING STRUCTURE AND MODULE

(71) Applicant: Fujikura Ltd., Tokyo (JP)

(72) Inventor: Kohei Matsumaru, Sakura (JP)

(73) Assignee: FUJIKURA LTD., Tokyo (JP)

( * ) Notice: Subject to any disclaimer, the term of this patent is extended or adjusted under 35 U.S.C. 154(b) by 282 days.

(21) Appl. No.: 15/746,900

(22) PCT Filed: Feb. 1, 2017

(86) PCT No.: PCT/JP2017/003617
§ 371 (c)(1),
(2) Date: Jan. 23, 2018

(87) PCT Pub. No.: WO2017/150060
PCT Pub. Date: Sep. 8, 2017

(65) Prior Publication Data
US 2020/0091057 A1  Mar. 19, 2020

(30) Foreign Application Priority Data

Feb. 29, 2016 (JP) ................................. 2016-038207

(51) Int. Cl.
| | |
|---|---|
| H01L 23/48 | (2006.01) |
| H01L 23/52 | (2006.01) |
| H01L 29/40 | (2006.01) |
| H01L 23/498 | (2006.01) |
| H01L 23/00 | (2006.01) |

(52) U.S. Cl.
CPC ........ *H01L 23/49838* (2013.01); *H01L 24/16* (2013.01); *H01L 2224/10175* (2013.01); *H01L 2224/16227* (2013.01)

(58) Field of Classification Search
None
See application file for complete search history.

(56) References Cited

U.S. PATENT DOCUMENTS

| | | | |
|---|---|---|---|
| 2013/0140692 A1* | 6/2013 | Kaneko | H05K 1/111 257/737 |
| 2014/0217582 A1* | 8/2014 | Baba | H01L 23/49822 257/737 |

FOREIGN PATENT DOCUMENTS

| | | |
|---|---|---|
| CN | 1282982 A | 2/2001 |
| CN | 105097558 A | 11/2015 |
| JP | 3-67355 B2 | 10/1991 |
| JP | 10-22413 A | 1/1998 |
| JP | 2003-23243 A | 1/2003 |

(Continued)

OTHER PUBLICATIONS

International Search Report dated Apr. 25, 2017, issued in counterpart International Application No. PCT/JP2017/003617 (1 page).

(Continued)

*Primary Examiner* — Calvin Y Choi
(74) *Attorney, Agent, or Firm* — Westerman, Hattori, Daniels & Adrian, LLP

(57) ABSTRACT

A mounting structure includes a semiconductor device including a first terminal, a wiring substrate including a second terminal having a first end, a wiring extracted from an end face of the first end, and a photosensitive insulating film that covers the wiring and the first end, the second terminal being disposed facing the first terminal, and a bump that electrically connects the first terminal and the second terminal.

8 Claims, 9 Drawing Sheets

(56) References Cited

FOREIGN PATENT DOCUMENTS

| | | |
|---|---|---|
| JP | 2005-085807 A | 3/2005 |
| JP | 2013-33836 A | 2/2013 |

OTHER PUBLICATIONS

Office Action dated Nov. 30, 2018, issued in counterpart Canadian Application No. 2,997,607. (4 pages).

* cited by examiner

MOUNTING STRUCTURE AND MODULE

TECHNICAL FIELD

The present invention relates to a mounting structure having a semiconductor device mounted on a wiring substrate and a module including the mounting structure.

Priority is claimed on Japanese Patent Application No. 2016-038207, filed on Feb. 29, 2016, the content of which is incorporated herein by reference.

BACKGROUND ART

In order to meet the needs for a reduction in the size of an electronic device and an increase in the speed thereof, a reduction in size and an increase in speed are also required in a technique for mounting a semiconductor device. Flip-chip bonding is adopted in various electronic devices as a method of mounting a semiconductor device, on account of the advantage in that the mounting area of a semiconductor device can be reduced and the length of a wiring can be shortened as compared with wire bonding.

The term "flip-chip bonding" refers to a mounting method in which a plurality of terminals of a semiconductor device such as an IC and a plurality of terminals of a wiring substrate are caused to face each other, and the respective terminals are collectively connected to each other with a bump such as solder interposed therebetween in a facedown manner (see, for example, Patent Document 1). In order to protect a wiring, a photosensitive insulating film is provided as a solder resist.

PRIOR ART DOCUMENTS

Patent Documents

[Patent Document 1] Japanese Unexamined Patent Application, First Publication No. 2003-23243

SUMMARY OF THE INVENTION

Problems to be Solved by the Invention

FIGS. 9A and 9B show a problem of the conventional art. In FIGS. 9A and 9B, a wiring 12 extending from a terminal 13 of a wiring substrate (not shown) which is connected to a terminal 21 of a semiconductor device (not shown) with a bump 16 interposed therebetween includes a portion which is not covered with a photosensitive insulating film 15. In this case, the wiring 12 is exposed, and a portion of solder wets and spreads from the bump 16 onto the wiring 12. In a case where a protruding portion 16a is formed on the narrow wiring 12, there may be a concern of the wiring 12 being broken due to thermal stress of the protruding portion 16a. In addition, in a case where solder wets and spreads onto the wiring 12 narrower than the terminal 13, the shape of the solder is not able to be controlled, and thus there may be a concern of the shape symmetry of the bump 16 being lost. Particularly, in a case where a high-frequency signal is transmitted between the semiconductor device and the wiring, the protruding portion 16a serves as an oscillation portion or a stub and thus there is the possibility of a transmission loss being deteriorated, which leads to an undesirable result.

In a case where an opening of the photosensitive insulating film is made smaller than the terminal of the wiring substrate, it is possible to avoid wetting and spreading of the solder from the terminal to the wiring. However, a high degree of accuracy equivalent to that of the terminal of the semiconductor device is required even when the photosensitive insulating film is formed on the wiring substrate by photolithography, which results in an increase in manufacturing costs of the wiring substrate.

Patent Document 1 discloses a technique for making an opening of a photosensitive insulating film larger than a terminal of a wiring substrate, and preventing solder from wetting and spreading by covering an exposed wiring with the photosensitive insulating film. However, this technique exhibits an effect only in a case where position alignments are completely coincident with each other between the wiring substrate and the photosensitive insulating film. Paragraphs 0035 to 0039 of Patent Document 1 show that the size of the terminal is 0.15 to 0.85 mm, and the width of the wiring is 0.1 to 0.15 mm, but in order to achieve a further reduction in size, there is a problem of a shift in alignment occurring the performance of equipment, a variation, or the like. That is, in a case where alignment shifts between the terminal and the photosensitive insulating film, the entire wiring is not able to be covered with the photosensitive insulating film, and thus it is not possible to prevent solder from wetting and spreading onto the wiring 12 as shown in FIGS. 9A and 9B.

In a case where the wiring is extracted from the terminal in the depth direction of the substrate, the wiring is not exposed even when the opening of the photosensitive insulating film shifts from the position of the terminal, and thus it is possible to prevent the solder for wetting and spreading. However, in order to multi-layer the wiring substrate, the number of processes increases, and manufacturing costs increase. In addition, in a structure in which the wiring is extracted downward from the terminal due to multi-layering, stress such as constriction associated with the solidification of the solder is generated immediately below the bump when the terminal of the semiconductor device and the terminal of the wiring substrate are connected to each other by the bump, and thus there may be a concern of the reliability of connection deteriorating. Further, since the multi-layered structure is a structure in which the interlayer insulating film is interposed by conductors, there may be a concern of a transmission loss being deteriorated due to an increase in a capacitance component. In addition, in a case where an insulating film is disposed between the conductors, a shortening in the wavelength of a signal transmitted to the conductors occurs, and frequency characteristics change as compared with a case where the multi-layered structure is not used, which leads to a problem of design being complicated.

The present invention is contrived in view of such circumstances, and an object thereof is to provide a mounting structure capable of easily suppressing wetting and spreading of a hump on a wiring and a module including the mounting structure.

Means for Solving the Problems

In order to solve the above problem, a mounting structure according to a first aspect of the present invention includes a semiconductor device including a first terminal, a wiring substrate including a second terminal having a first end, a wiring extracted from an end face of the first end, and a photosensitive insulating film that covers the wiring and the first end, the second terminal being disposed facing the first terminal, and a bump that electrically connects the first terminal and the second terminal.

The semiconductor device may include a plurality of the first terminals, the wiring substrate may include a plurality of the second terminals and a plurality of the wirings, a plurality of the bumps may be provided between the plurality of the first terminals and the plurality of the second terminals, the plurality of the first terminals may be provided in parallel with each other in a peripheral portion of the semiconductor device, and the plurality of the second terminals and the plurality of the bumps may be provided in parallel with each other so as to correspond to the plurality of the first terminals.

A plurality of third terminals may be provided on ends opposite to the plurality of the second terminals in the plurality of the wirings, and the plurality of the third terminals may be provided in parallel with each other at a pitch wider than that of the plurality of the first terminals.

Coverage rates at which the photosensitive insulating film covers the plurality of the second terminals may be equal to each other between the plurality of the second terminals.

The wiring substrate may have a plurality of the first ends, and an end of the photosensitive insulating film that covers the plurality of the first ends may be formed along a parallel direction of the plurality of the second terminals.

A module according to a second aspect of the present invention includes the mounting structure according to the above aspects.

Effects of Invention

According to the above aspects, a shift in alignment can be allowed at a position where the photosensitive insulating film covers the side of the second terminal from which the wiring is extracted, and thus it is possible to easily suppress wetting and spreading of the bump onto the wiring.

EMBODIMENTS FOR CARRYING OUT THE INVENTION

Hereinafter, the present invention will be described with reference to the accompanying drawings, on the basis of a preferred embodiment.

Figure 1A:
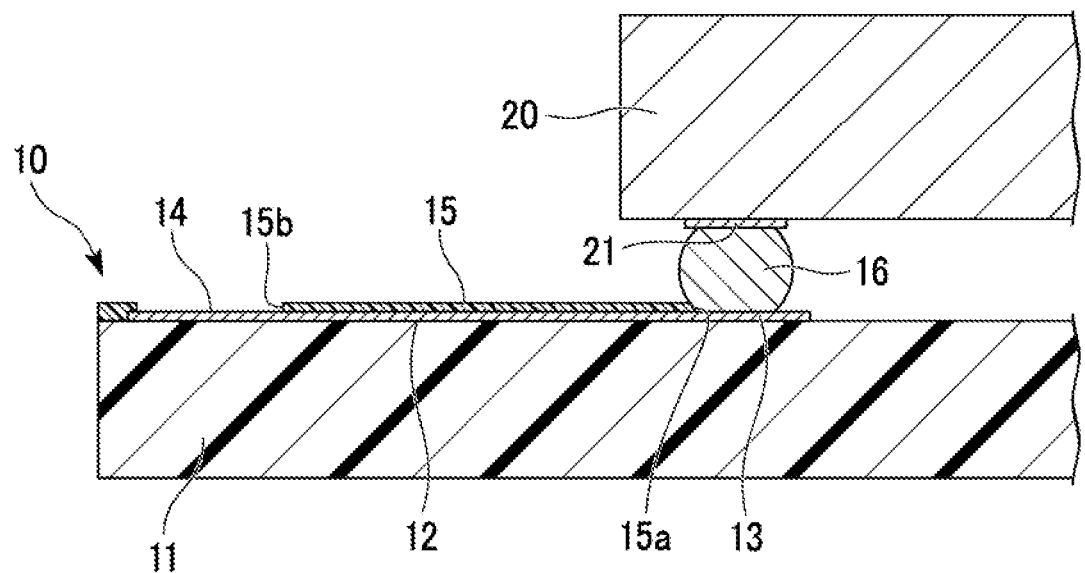
FIG. 1A is a cross-sectional view showing a mounting structure according to an embodiment of the present invention.
Figure 1B:
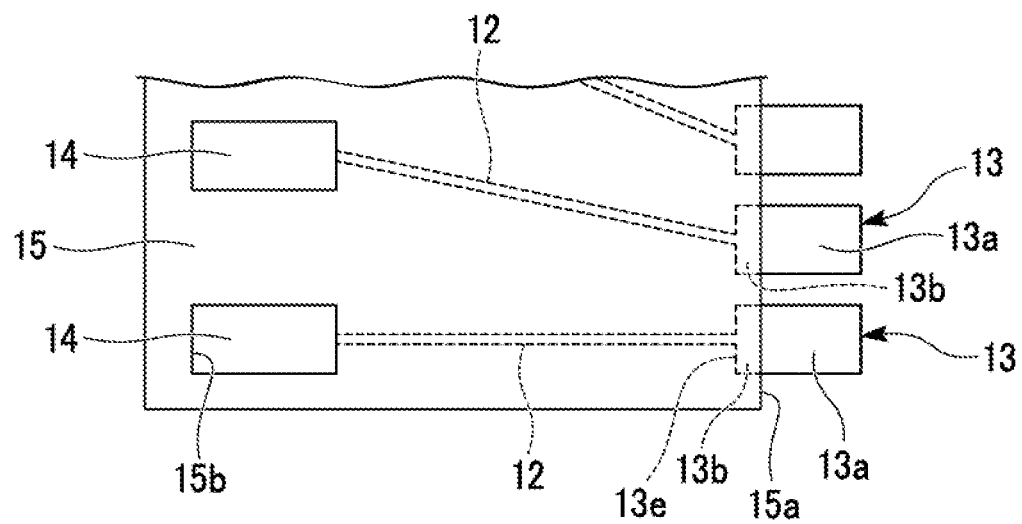
FIG. 1B is a plan view showing a mounting structure according to an embodiment of the present invention.

FIGS. 1A and 1B show a mounting structure according to an embodiment of the present invention. As shown in FIGS. 1A and 1B, the mounting structure according to the present embodiment including a semiconductor device 20 having a first terminal 21, a wiring substrate 10 having a second terminal 13 disposed facing the first terminal 21, and a bump 16 that electrically connects the first terminal 21 and the second terminal 13.

As shown in FIG. 1A, the wiring substrate 10 has a wiring 12 and terminals 13 and 14 on an insulating substrate 11. In the present specification, the terminal 13 which is connected to the first terminal 21 with the bump 16 interposed therebetween is set to the second terminal 13, and the terminal 14 provided on the end of the wiring 12 opposite to the second terminal 13 is set to the third terminal 14. The first terminal 21 is the terminal 21 of the semiconductor device 20. In the wiring substrate 10, the upper portion of the wiring 12 is covered with a photosensitive insulating film 15 throughout the entire length. The photosensitive insulating film 15 is provided as a solder resist.

As shown in FIG. 1B, the width of each of the terminals 13 and 14 is larger than the width of the wiring 12. The photosensitive insulating film 15 covers only a side (first end 13b constituting a portion of the second terminal 13) where the wiring 12 is extracted, on the second terminal 13. That is, the second terminal 13 has an exposed portion 13a which is not covered with the photosensitive insulating film 15 and a covered portion 13b which is covered with the photosensitive insulating film 15, and the covered portion 13b is disposed on only a side (first end 13b constituting a portion of the second terminal 13) where the wiring 12 is extracted from the second terminal 13 (end face 13e of the first end 13b in the second terminal 13). In other words, the covered portion 13b constitutes a portion of the second terminal 13, and the covered portion 13b corresponds to the first end 13b. As a result, a length along which an end 15a of the photosensitive insulating film 15 traverses on the second terminal 13 is larger than the width of the wiring 12. In addition, the end 15a of the photosensitive insulating film 15 has a shape extending substantially linearly along a direction in which a plurality of second terminals 13 are in parallel with each other.

The exposed portion 13a is provided on an end (second end) on the opposite side to the side (first end) of the second terminal 13 where the wiring 12 is extracted. It is preferable that the planar size (area) of the exposed portion 13a be the same as or larger than the sizes (area) of the first terminal 21 opposite thereto. That is, it is preferable that the exposed portion 13a be provided on the outer side (external portion)

of a region facing the first terminal 21 on the wiring substrate 10. As a result, since the bump 16 is not likely to wet and spread from the exposed portion 13*a* to the outer side, and is located on the photosensitive insulating film 15, for example, even in a case where solder protrudes to the outer side, it is possible to prevent the bump from being attached to the wiring 12.

The solder is not attached onto the wiring 12 having a small width, and thus it is possible to suppress the breakage, damage or the like of the wiring 12 due to thermal stress or the like, and to improve reliability. It is possible to control the shape of the bump 16 through the end 15*a* of the photosensitive insulating film 15, and to suppress an asymmetric shape such as protrusion. The bump 16 has high shape symmetry, and is formed in a shape having fine small irregularities. As a result, even in a case where a high-frequency signal is transmitted, it is possible to suppress signal deterioration. Examples of the shape symmetry of the second terminal 13 or the exposed portion 13*a* of the second terminal 13 include line symmetry in the extraction direction (length direction) of the wiring 12 and line symmetry in the width direction thereof.

Since the wiring 12 is extracted from the second terminal 13 (end face 13*e* of the first end 13*b* in the second terminal 13) in the plane direction of the wiring substrate 10, a case does not occur in which the wiring 12 is disposed immediately below the bump 16. As a result, stress such as constriction associated with the solidification of solder is not likely to influence the wiring 12, and thus it is possible to secure reliability. In addition, since an insulator (dielectric) such as an interlayer insulating film in a case where the wiring 12 is connected directly to the second terminal 13 and is multi-layered is not interposed between the wiring 12 and the second terminal 13, and the wiring 12 is a single layer, it is also possible to suppress the transmission loss due to a capacitance component.

In FIGS. 1A and 1B, the extraction direction of the wiring 12 is a horizontal direction (direction from the third terminal toward the second terminal), but it is preferable that, in the horizontal direction, the length of the second terminal 13 of the wiring substrate 10 be larger than the length of the first terminal 21 of the semiconductor device 20. It is preferable that a difference between the length of the second terminal 13 and the length of the first terminal 21 be the same as or larger than the length of a shift in alignment. According to the present embodiment, the degree of accuracy when the pattern of the photosensitive insulating film 15 is formed on the wiring substrate 10 by photolithography can be made lower than the degree of positional accuracy of the terminal 21 of the semiconductor device 20 (an error can be made larger), it is possible to use relatively inexpensive processes and devices. As a result, it is possible to achieve a reduction in costs of a mounting process.

As shown in FIG. 1B, in the present embodiment, a plurality of third terminals 14 are provided in parallel with each other at a pitch wider than that of the plurality of second terminals 13. The third terminal 14 electrically connects the wiring substrate 10 to an external circuit (not shown), and thus can be used in signal transmission, electric power supply, or the like. The periphery the third terminal 14 is covered with the photosensitive insulating film 15, and the upper surface of the third terminal 14 is exposed by an opening 15*b* of the photosensitive insulating film 15. Since the degree of positional accuracy of the end 15*a* of the photosensitive insulating film 15 may be low, it is also possible to be lower the degree of positional accuracy of the opening 15*b* by increasing the pitch of the third terminal 14.

In the present embodiment, a plurality of first terminals 21 are provided in parallel with each other in a peripheral portion on the lower surface of the semiconductor device 20. The second terminal 13 is provided facing the first terminal 21, and the bump 16 is provided at each place where the first terminal 21 and the second terminal 13 face each other. Therefore, the pitch of the second terminal 13 is the same as the pitch of the first terminal 21. Since the third terminal 14 is disposed in the peripheral portion of the wiring substrate 10, it is possible to secure a wide pitch without being restricted by the size of the semiconductor device 20.

It is preferable that the photosensitive insulating film 15 be not disposed between the first terminal 21 and the second terminal 13. As a result, in a case where an insulating film is disposed between the first terminal 21 and the second terminal 13, it is possible to select a material (resin) of which the dielectric constant and the dielectric loss tangent are low, and to suppress the influence of a change in frequency due to a shortening in wavelength. The material of the photosensitive insulating film 15 to be selected may be a material (resin) of which the dielectric constant and the dielectric loss tangent are low, but a more preferred material may be selected from the viewpoint of photosensitivity, a process of photolithography, or the like.

Figure 2:
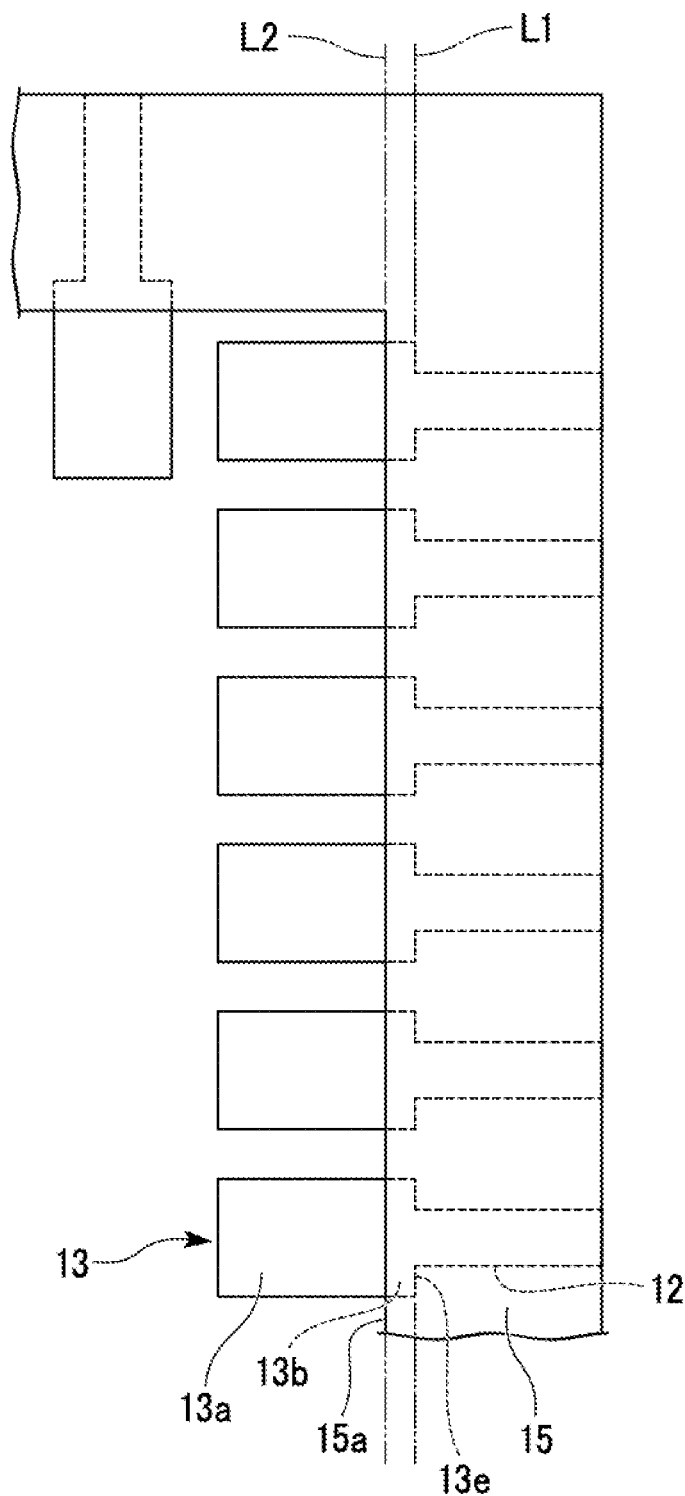
FIG. 2 is a plan view showing a positional relationship between a photosensitive insulating film and a second terminal.

As shown in FIG. 2, the covered portion 13*b* of second terminal 13 has a size (length) equivalent to a distance between a straight line L1 along a boundary between the second terminal 13 and the wiring 12 and a straight line L2 along the end 15*a* of the photosensitive insulating film 15. Therefore, insofar as a shift in the end 15*a* of the photosensitive insulating film 15 does not attain the wiring 12 side (position close to the wiring 12) rather than the straight line L1, it is possible to prevent the exposure of the wiring 12. Therefore, it is preferable that the distance on design between the straight line L1 and the straight line L2 be larger than an error range due to a shift in alignment of the photosensitive insulating film 15 with respect to the pattern of the wiring 12. As a result, even in a case where a shift in alignment is present, the wiring 12 can be configured not to be exposed from the photosensitive insulating film 15.

In a case where the plurality of second terminals 13 are provided, the proportion of the area of the covered portion 13*b* to the area of the second terminal 13 (total area of the exposed portion 13*a* and the covered portion 13*b*) is a coverage rate at which the photosensitive insulating film 15 covers the second terminal 13. It is preferable that the coverage rates of the respective second terminals 13 in the plurality of second terminals 13 be the same as each other.

Since the coverage rates of the respective second terminals 13 are equal to each other, the sizes of the bumps 16 formed on the exposed portions 13*a* become uniform, and thus it is possible to suppress a variation between the terminals. Examples of the coverage rate include 50% or less of the area of the second terminal 13, for example, approximately 30%, approximately 20%, approximately 10%, approximately 5%, and the like. Examples of the variation of the coverage rate include 20% or less, 10% or less, 5% or less, and the like of the area of the second terminal 13.

It is preferable that the end 15*a* of the photosensitive insulating film 15 along the covered portions 13*b* of the plurality of second terminals 13 be along the parallel direction of the plurality of second terminals 13. As a result, even in a case where a shift in alignment is present, it is possible to suppress a variation in the coverage rate of each second terminal 13 along the same parallel direction.

Hereinbefore, although the present invention has been described according to the preferred embodiment, the present invention is not limited to the above-described embodiment, and can be modified variously without departing from the scope of the present invention. Examples of modifications include addition, omission, and replacement of components, and other changes.

An example of the semiconductor device 20 includes a semiconductor circuit such as an integrated circuit (IC). It is preferable that the first terminals 21 in the semiconductor device 20 be disposed in parallel row by row on one side or two or more sides along the sides of the semiconductor device 20. Examples of sides on which the first terminals 21 are disposed include two sides facing each other, two sides adjacent to each other, and four sides in a case where the semiconductor device 20 is substantially rectangular.

An example of the wiring substrate 10 includes an interposer substrate such as a flexible printed circuit (FPC). The insulating substrate 11 of the wiring substrate 10 is not particularly limited, and examples thereof include a resin substrate of polyimide or the like, a glass substrate, a paper composite substrate, and various insulating substrates.

Conductors constituting the wiring 12 and the terminals 13 and 14 are not particularly limited, and examples of materials thereof include one type or two types or more of Cu, Ag, Al, Ni, Cr, Au, Ti, and alloy or the like. The conductor patterns of the wiring 12, the terminals 13 and 14, and the like can be formed by plating, etching, paste or the like on one side or both sides of the insulating substrate 11. Examples of the width of the wiring 12 capable of being exemplified include 100 μm or less and 70 μm or less, for example, 20 to 70 μm. Examples of the size of the second terminal 13 capable of being exemplified include 200 μm or less, 150 μm or less, and 100 μm or less, for example, 30 to 100 μm.

An example of the photosensitive insulating film 15 includes a solder resist such as a photosensitive epoxy resin.

Examples of the bump 16 include molten solder, a plated pillar, a stud bump, and the like. A gap between the upper surface of the wiring substrate 10 and the lower surface of the semiconductor device 20 can be filled with an insulating material such as an underfill agent or a sidefill agent in the periphery of at least the bump 16. An example of the insulating material for filling includes a thermosetting resin such as epoxy.

EXAMPLES

Example 1

Figure 3A:
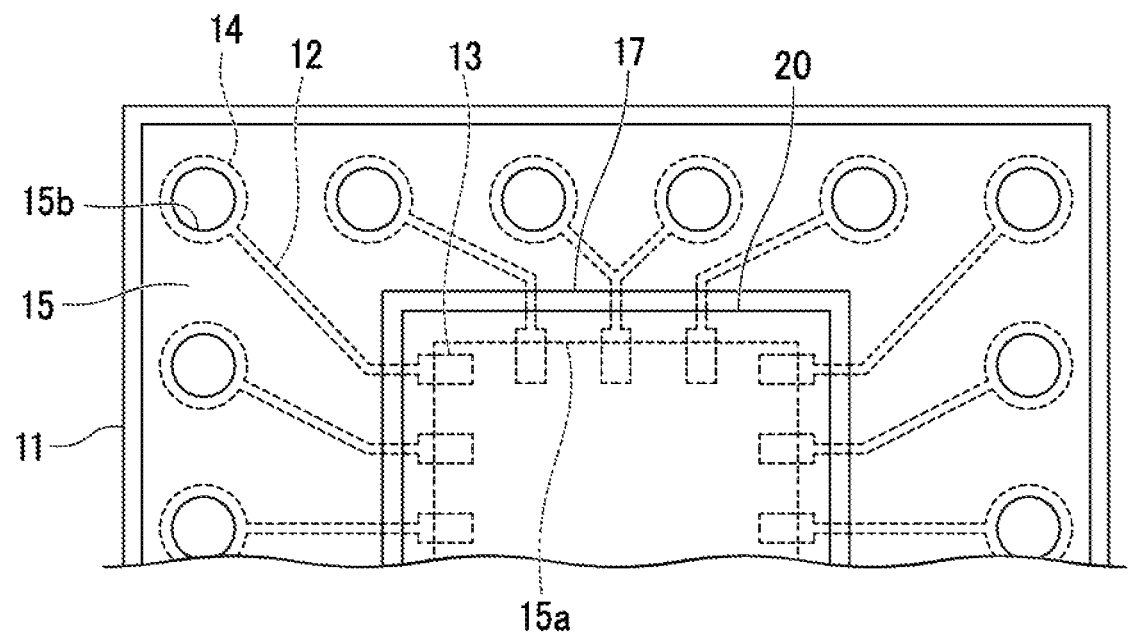
FIG. 3A is a plan view showing a mounting structure of Example 1.
Figure 3B:
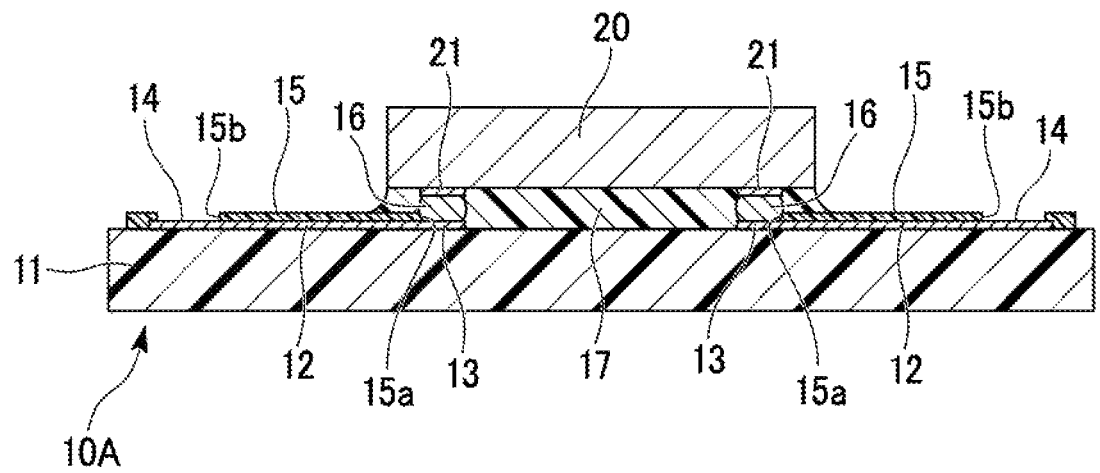
FIG. 3B is a cross-sectional view showing the mounting structure of Example 1.

FIGS. 3A and 3B show a mounting structure of Example 1. The mounting structure according to Example 1 constitutes a module structure of an interposer substrate on which an IC is mounted as the semiconductor device 20. A wiring substrate 10A of Example 1 is an interposer substrate, and connects the IC terminal (first terminal 21) having a narrow pitch of approximately 100 μm and the FPC terminal (third terminal 14) having a wide pitch of approximately 500 μm.

The photosensitive insulating film 15 completely covers the wiring 12, but the photosensitive insulating film 15 is opened inside the end 15a in a region surrounded by the I/O terminal (second terminal 13) for an IC. The width of the second terminal 13 (size in a pitch direction, or the width of the second terminal 13 in a direction in which a plurality of second terminals are arranged) is, for example, 70 μm. The width of the wiring 12 is, for example, 30 μm. The wiring 12 and the terminals 13 and 14 are formed to be flush with the insulating substrate 11.

A length (length of the covered portion (first end) 13b in the longitudinal direction of the second terminal 13a shown in FIG. 1B) along which the photosensitive insulating film 15 covers the upper portion of the terminal 13 from a connecting portion (end face 13e of the first end 13b in the second terminal 13) between the wiring 12 and the terminal 13 to the opened end 15a is a size (for example, 30 μm) enough to absorb a shift in alignment (for example, 20 μm) between the wiring 12 and the photosensitive insulating film 15. The length of the terminal 13 in a direction in which the wiring 12 is extracted is, for example, a total (for example, 100 μm) of the width of the terminal 13 and a size large enough to absorb a shift in alignment.

The shape of the terminal 13 of a portion (connectable to the bump 16) exposed without being covered with the photosensitive insulating film 15 is rectangular, and has symmetry. The periphery of bump 16 is filled with an underfill agent 17 such as epoxy for the purpose of stress relaxation. The bump 16 is formed of solder, and the height of the bump 16 is, for example, 50 μm.

Example 2

Figure 4A:
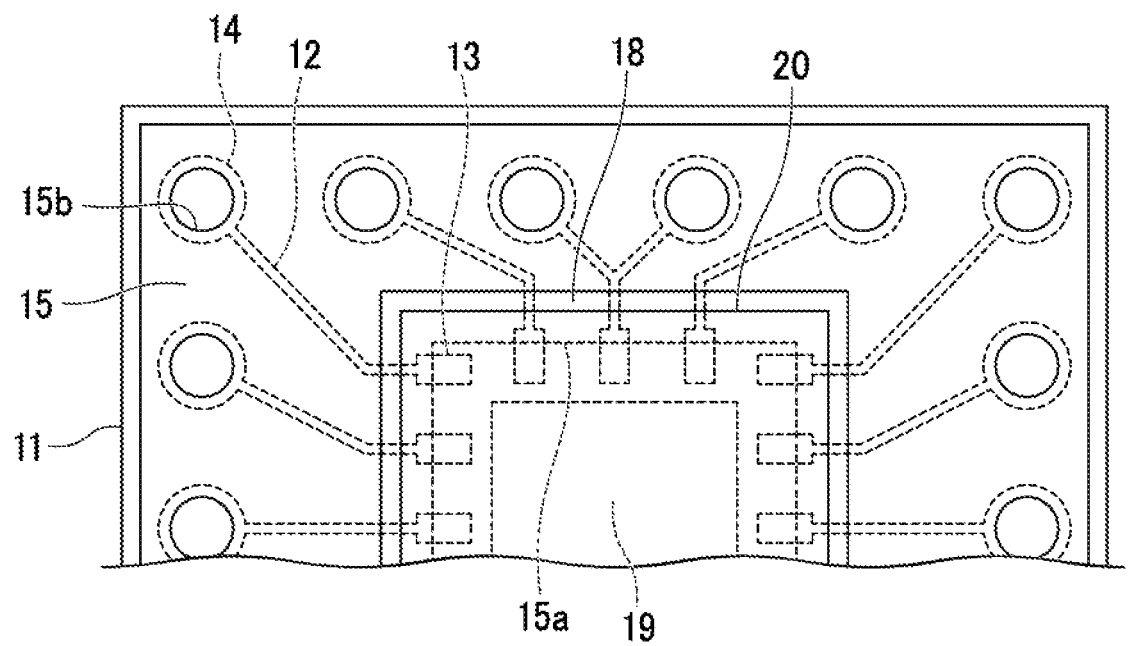
FIG. 4A is a plan view showing a mounting structure of Example 2.
Figure 4B:
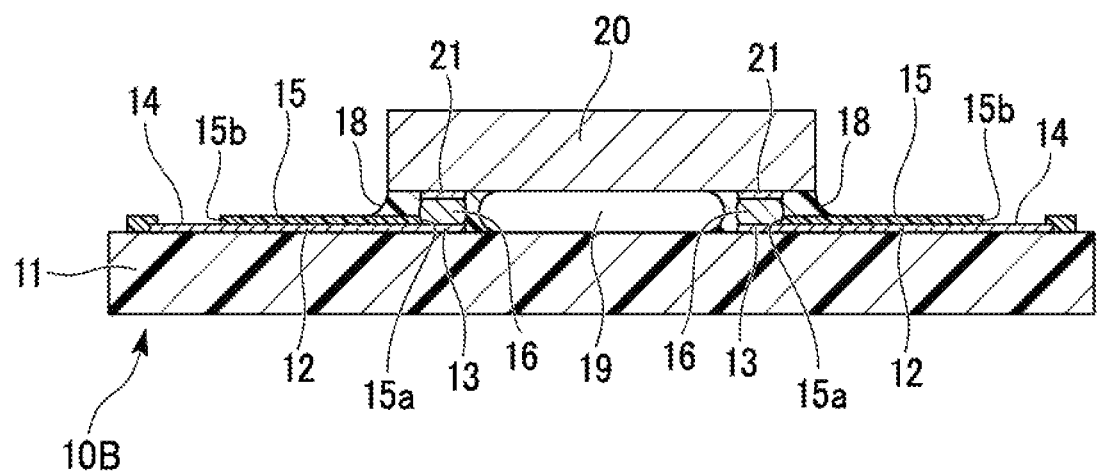
FIG. 4B is a cross-sectional view showing the mounting structure of Example 2.

FIGS. 4A and 4B show a mounting structure of Example 2. In Example 2, the configuration of a wiring substrate 10B is the same as that in Example 1, but an insulating material disposed in the periphery of the bump 16 is a sidefill agent 18. The sidefill agent 18 (such as, for example, an epoxy) is disposed only in a peripheral portion of the lower surface of the semiconductor device 20 in which the first terminal 21 and the bump 16 are provided, by the adjustment of viscosity. A cavity 19 is formed between the semiconductor device 20 and the wiring substrate 10B (specifically, between the semiconductor device and the insulating substrate 11). In case of use of high-frequency transmission, a transmission loss may deteriorate due to a dielectric between an IC and an interposer. Since gas (such as air) having a low dielectric constant is disposed in the cavity 19 by using the sidefill agent 18, a stress relaxation function can be obtained without being deteriorated a transmission loss as compared with the underfill agent 17 of Example 1.

Example 3

Figure 5A:
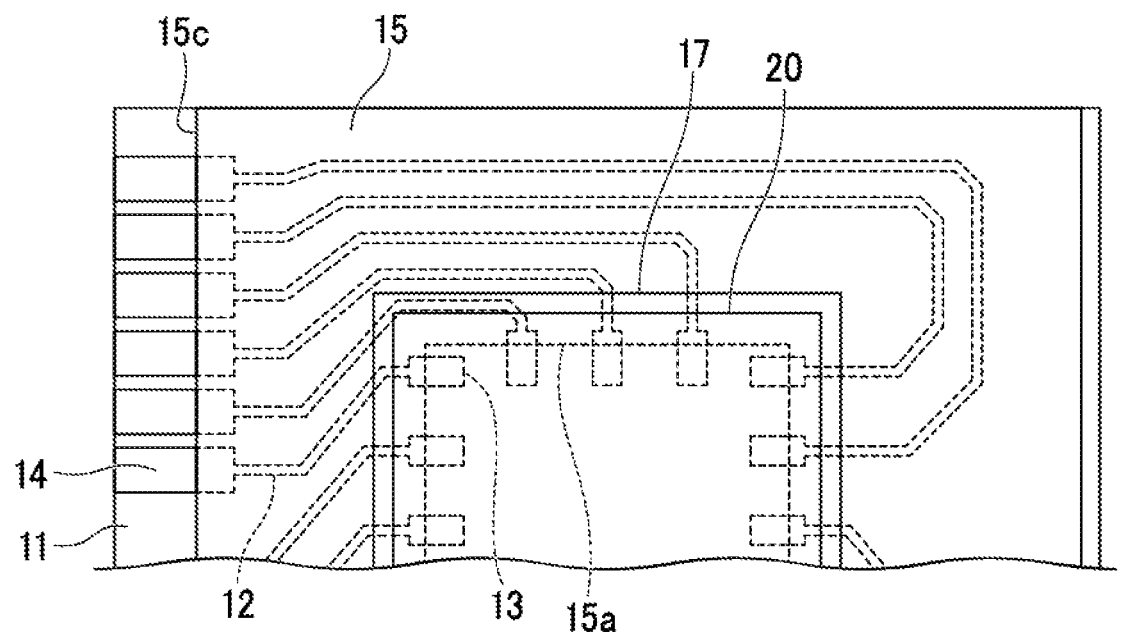
FIG. 5A is a plan view showing a mounting structure of Example 3.
Figure 5B:
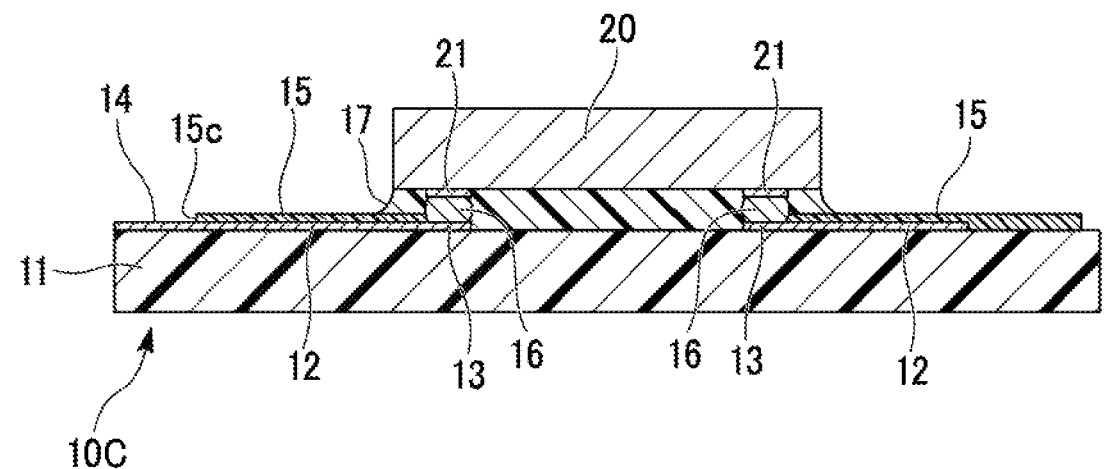
FIG. 5B is a cross-sectional view showing the mounting structure of Example 3.

FIGS. 5A and 5B show a mounting structure of Example 3. A wiring substrate 10C of Example 3 is configured such that the third terminal 14 constitutes a card edge connector. A structure immediately below the semiconductor device 20 shows a case where the same underfill agent 17 as that in Example 1 is used in FIGS. 5A and 5B, but the sidefill agent 18 can also be used as in Example 2. An end 15c of the photosensitive insulating film 15 which is in contact with a card edge connector is, for example, linear.

Example 4

Figure 6:
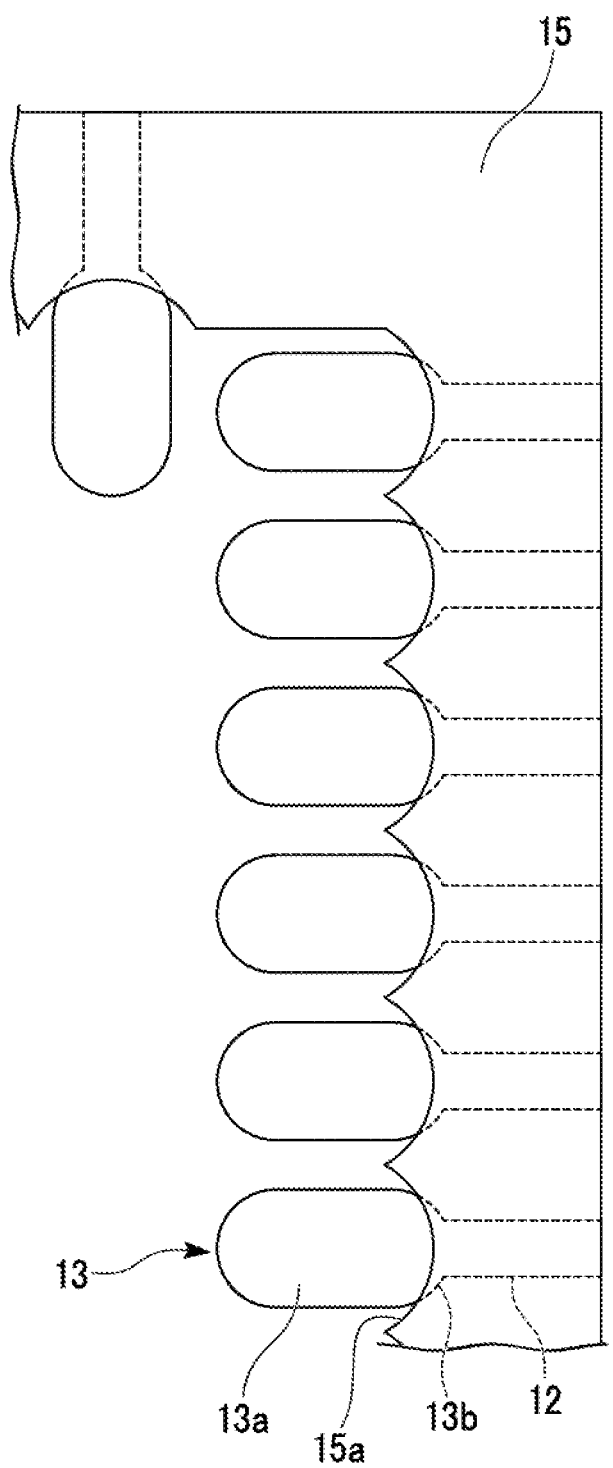
FIG. 6 is a plan view showing a wiring substrate of Example 4.

FIG. 6 shows shapes of a second terminal and a photosensitive insulating film in a wiring substrate of Example 4. The second terminal 13 is rectangular in FIG. 2, but the second terminal 13 is substantially circular in FIG. 6. The planar shape of the second terminal 13 in Example 4 is oval such as an elliptical shape, and an example thereof includes a shape (oval shape) in which semicircles are united with both short sides of rectangle. The corners of the terminal 13 are eliminated, and thus it is possible to prevent stress concentration, and to improve the adhesive strength of the terminal 13 with respect to the insulating substrate 11. An end 15a of the photosensitive insulating film 15 shown in FIG. 6 is formed in a wave shape having a curved portion for each terminal 13, and is acuminate (cusp-shaped) between the terminals 13. This case is preferable since the shape of an exposed portion 13a of the second terminal 13 is curved together with a covered portion 13b side and an opposite side to the covered portion 13b and the shape symmetry of the bump 16 is high.

Comparative Example 1

Figure 7A:
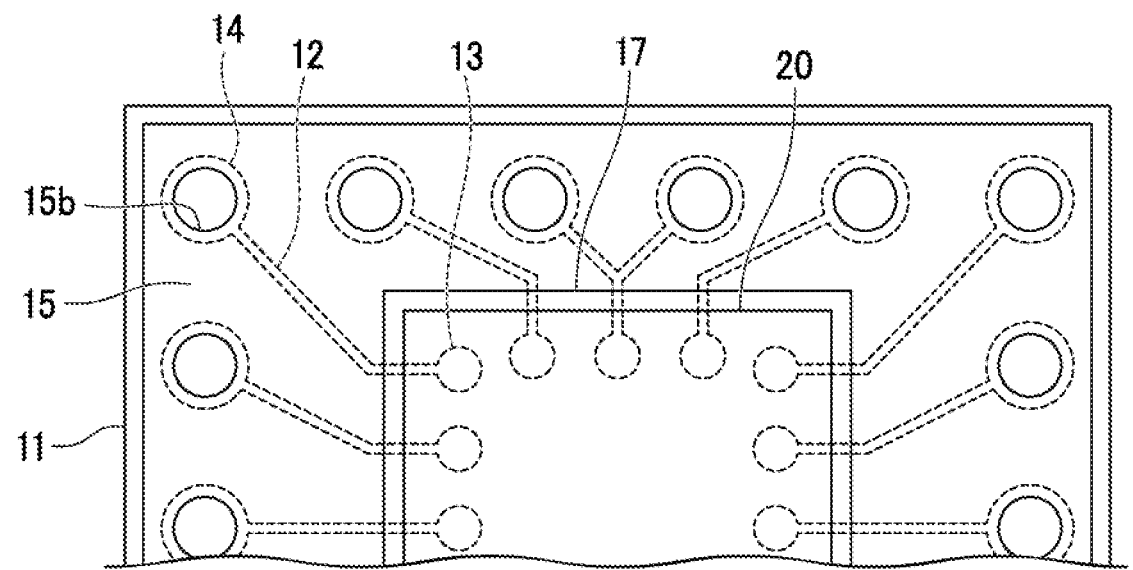
FIG. 7A is a plan view showing a mounting structure of Comparative Example 1.
Figure 7B:
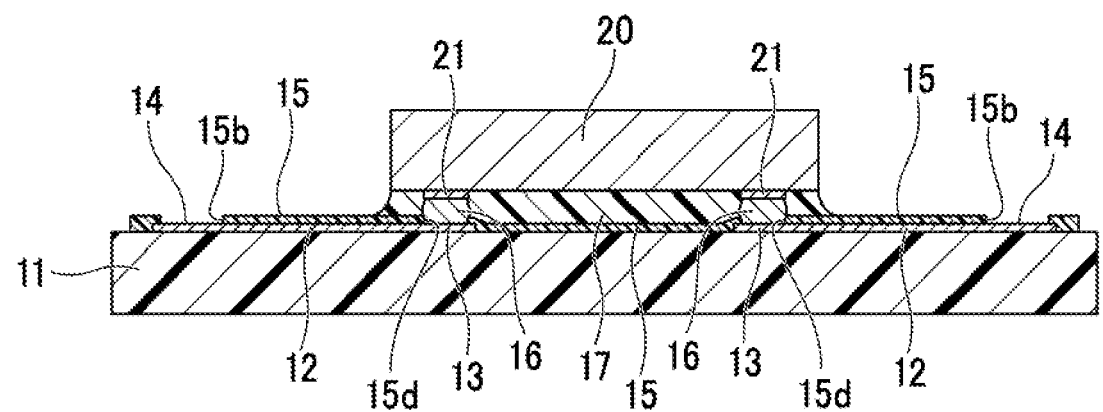
FIG. 7B is a cross-sectional view showing the mounting structure of Comparative Example 1.
Figure 7C:
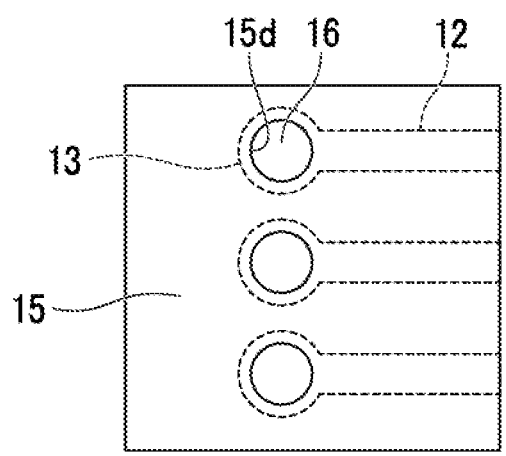
FIG. 7C is an enlarged plan view showing the periphery of a bump shown in the mounting structure of Comparative Example 1.

FIGS. 7A to 7C show a mounting structure of Comparative Example 1. The photosensitive insulating film 15 has an opening 15d for each second terminal 13, and the peripheral portion of the opening 15d covers the peripheral portion of the second terminal 13 throughout the entire circumference. It is possible to prevent the exposure of the wiring 12 by making the opening 15d of the photosensitive insulating film 15 smaller than the terminal 13, and to avoid wetting and spreading of solder from the terminal 13 to the wiring 12. However, when the photosensitive insulating film 15 is formed by photolithography, a high degree of accuracy is required, which results in an increase in manufacturing costs of a wiring substrate.

Comparative Example 2

Figure 8A:
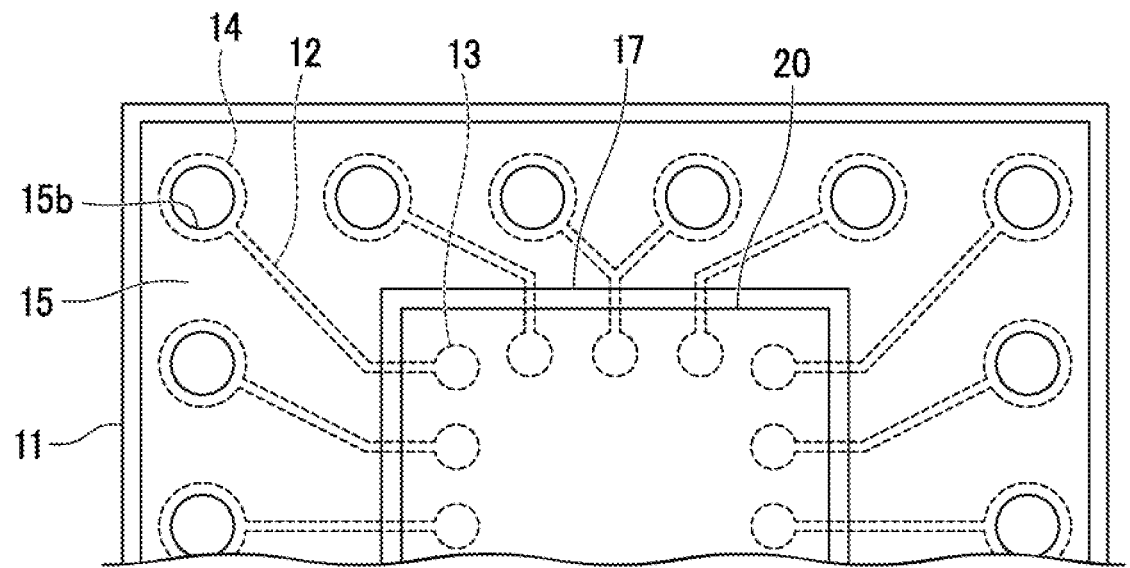
FIG. 8A is a plan view showing a mounting structure of Comparative Example 2.
Figure 8B:
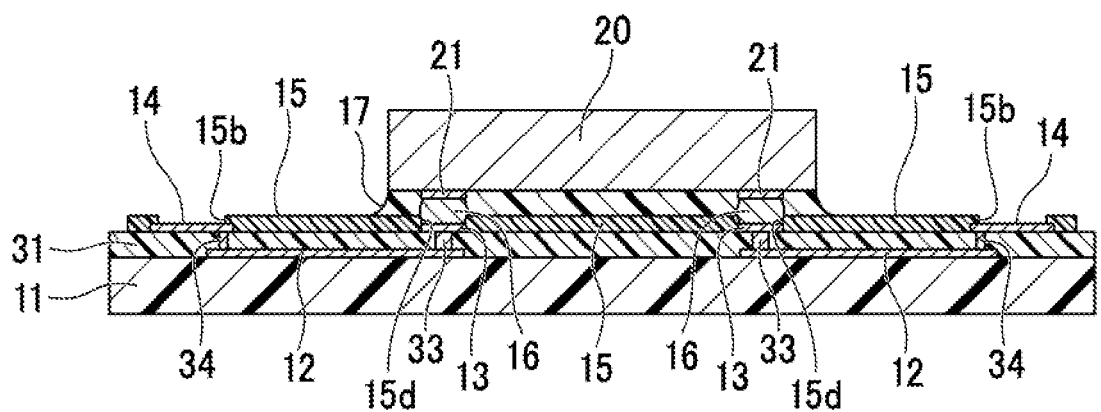
FIG. 8B is a cross-sectional view showing the mounting structure of Comparative Example 2.
Figure 8C:
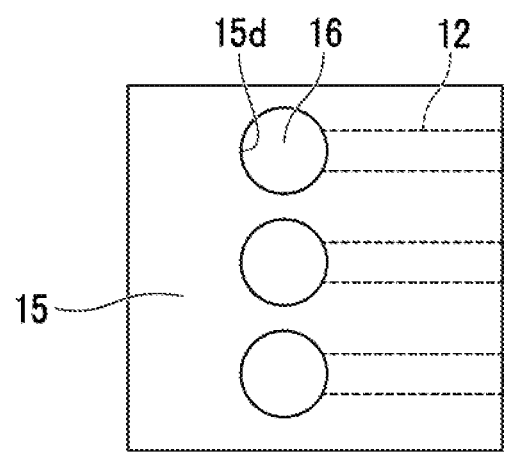
FIG. 8C is an enlarged plan view showing the periphery of a bump shown in the mounting structure of Comparative Example 2.
Figure 9A:
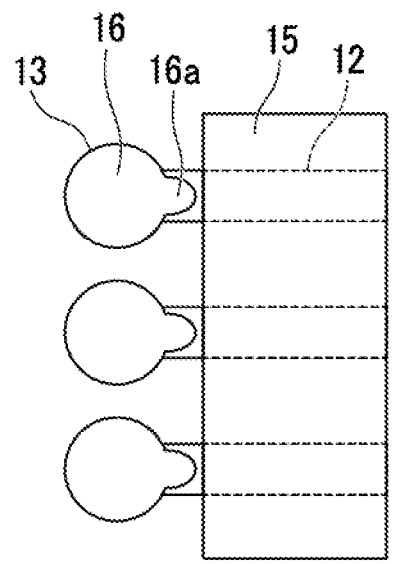
FIG. 9A is a plan view showing wetting and spreading of solder from a bump onto a wiring.
Figure 9B:
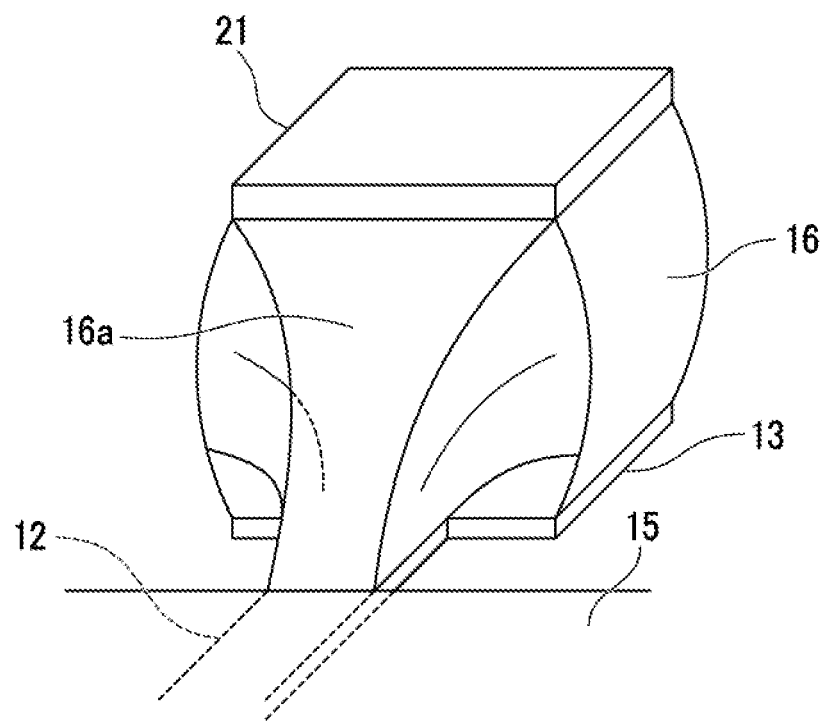
FIG. 9B is a perspective view showing wetting and spreading of solder from a bump onto a wiring.

FIG. 8A to FIG. 8C show a mounting structure of Comparative Example 2. The wiring 12 is extracted from the terminal 13 in the depth direction of the insulating substrate 11 and an interlayer insulating film 31 is provided between the wiring 12 and the terminal 13. According to the structure of Comparative Example 2, the wiring 12 is not exposed even in a case where the opening 15d of the photosensitive insulating film 15 shifts from the position of the terminal 13, and thus it is possible to prevent solder from wetting and spreading. However, in order to multi-layer a wiring substrate, an opening is formed in an interlayer insulating film 31, and the opening of the interlayer insulating film 31 is provided with conductors 33 and 34, which leads to an increase in the number of processes such as connection between the terminals 13 and 14 and the wiring 12, and to an increase in manufacturing costs.

In addition, since the conductor 33 that connects the terminal 13 and the wiring 12 is provided below the bump 16, there may be a concern of the reliability of connection deteriorating in a case where stress is generated immediately below the bump 16 when solder of the bump 16 solidifies. In addition, since the interlayer insulating film 31 is interposed between the wiring 12 and the terminals 13 and 14, there may be a concern of a deterioration in a transmission loss due to a capacitance component or the complication of design due to a shortening in wavelength.

DESCRIPTION OF REFERENCE NUMERAL 10, 10A, 10B, 10C: wiring substrate
11: insulating substrate
12: wiring
13: second terminal
13b: covered portion (first end)
13e: end face (end face of first end in second terminal)
14: third terminal
15: photosensitive insulating film
16: bump
20: semiconductor device
21: first terminal

The invention claimed is:

1. A mounting structure comprising:
a semiconductor device including a first terminal;
a wiring substrate including a second terminal having a first end, a wiring extracted from an end face of the first end, and a photosensitive insulating film that covers the wiring and the first end, the second terminal being disposed facing the first terminal, the second terminal and the wiring being provided on one surface of the wiring substrate such that the second terminal and the wiring are in direct contact with the one surface of the wiring substrate; and
a bump that electrically connects the first terminal and the second terminal.

2. The mounting structure according to claim 1, wherein the first terminal includes a plurality of the first terminals,
the second terminal includes a plurality of the second terminals, and the wiring includes a plurality of the wirings extracted from the plurality of the second terminals respectively,
the bump includes a plurality of the bumps which are provided between the plurality of the first terminals and the plurality of the second terminals respectively,
the plurality of the first terminals are provided in parallel with each other in a peripheral portion of the semiconductor device, and
the plurality of the second terminals and the plurality of the bumps are provided in parallel with each other so as to correspond to the plurality of the first terminals.

3. The mounting structure according to claim 2, wherein a plurality of third terminals are provided on ends opposite to the plurality of the second terminals in the plurality of the wirings, and
the plurality of the third terminals are provided in parallel with each other at a pitch wider than that of the plurality of the first terminals.

4. The mounting structure according to claim 2, wherein coverage rates at which the photosensitive insulating film covers the plurality of the second terminals are equal to each other between the plurality of the second terminals.

5. The mounting structure according to claim 2, wherein an end of the photosensitive insulating film that covers the plurality of the first ends of the plurality of the second terminals is formed along a parallel direction of the plurality of the second terminals.

6. A module comprising the mounting structure according to claim 1.

7. The mounting structure according to claim 5, wherein the photosensitive insulating film covers an upper surface of the plurality of the first ends of the plurality of the second terminals.

8. The mounting structure according to claim 1, wherein the second terminal includes a second end located opposite to the first end along a plane direction of the wiring substrate, the second end being exposed from the photosensitive insulating film.

* * * * *